United States Patent [19]
Walpita et al.

[11] Patent Number: 5,965,273
[45] Date of Patent: Oct. 12, 1999

[54] POLYMERIC COMPOSITIONS HAVING A TEMPERATURE-STABLE DIELECTRIC CONSTANT

[75] Inventors: Lakshaman M. Walpita, Basking Ridge; Michael R. Ahern, Bayonne, both of N.J.

[73] Assignee: Hoechst Celanese Corporation, Somerville, N.J.

[21] Appl. No.: 08/792,333

[22] Filed: Jan. 31, 1997

[51] Int. Cl.⁶ ........................................................ B32B 3/00
[52] U.S. Cl. ........................ 428/457; 428/323; 428/325; 428/328; 428/461; 428/500; 428/689; 428/901; 106/286.4; 361/321.1; 361/750
[58] Field of Search ..................... 428/457, 458, 428/460, 461, 469, 471, 212, 323, 325, 327, 901, 421, 459, 446, 402, 500, 689, 328; 106/600, 902, 287.35, 400, 413, 823, 286.4; 526/160; 361/321.1, 321.5, 750; 252/518, 520, 500; 264/239

[56] References Cited

U.S. PATENT DOCUMENTS

| | | | |
|---|---|---|---|
| 4,335,180 | 6/1982 | Traut et al. | 428/303 |
| 5,051,542 | 9/1991 | Hernandez | 174/72 B |
| 5,087,677 | 2/1992 | Brekner et al. | 526/160 |
| 5,154,973 | 10/1992 | Imagawa et al. | 428/325 |
| 5,358,775 | 10/1994 | Horn et al. | 428/209 |
| 5,552,210 | 9/1996 | Horn et al. | 428/209 |
| 5,658,994 | 8/1997 | Burgoyne et al. | 525/390 |
| 5,702,629 | 12/1997 | Cui et al. | 252/62.9 R |
| 5,739,193 | 4/1998 | Walpita et al. | |

FOREIGN PATENT DOCUMENTS

| | | |
|---|---|---|
| 3242657 | 5/1983 | Germany. |
| 63-063728 | 3/1988 | Japan. |
| 1-245059 | 9/1989 | Japan. |
| 4-161461 | 6/1992 | Japan. |
| 5-57853 | 3/1993 | Japan. |
| 5-98069 | 4/1993 | Japan. |
| 5-307911 | 11/1993 | Japan. |

OTHER PUBLICATIONS

S. Asai, et al., "Fabrication of an Insulated Metal Substrate having an Insulating layer with a High Dilectric Constant" IEEE Transactions on Components, Hybrids and Manufacturing Technology, vol. 16, No. 5, Aug., 1993, pp. 499–504.

*Primary Examiner*—Stevan A. Resan

[57] ABSTRACT

A polymeric composition which has a dielectric constant K' greater than 4 at 20° C. which varies little with temperature is made from a polymer or mixture of polymers and a ceramic or a mixture of ceramics, where the polymer or mixture of polymers has a dielectric constant K' in the range of about 1.5 to about 3.5 and a temperature coefficient of dielectric constant TCK' that is negative and is between 0 and about −300 ppm/degree C.; and the ceramic includes a first ceramic, which may be one ceramic or a mixture of ceramics, each having a dielectric constant in the range of about 15 to about 200 and a TCK' that is positive and is between zero and about 3000 ppm/degree C.; and an optional second ceramic, which may be one ceramic or a mixture of ceramics, each having a dielectric constant in the range from about 3 up to about 15 and a TCK' that is positive and is between zero and about 300 ppm/degree C.

17 Claims, No Drawings

ð 5,965,273

POLYMERIC COMPOSITIONS HAVING A TEMPERATURE-STABLE DIELECTRIC CONSTANT

FIELD OF THE INVENTION

This invention relates generally to the field of materials having a high dielectric constant, and more particularly to filled thermoplastic polymers that have a high dielectric constant that changes little with temperature.

BACKGROUND OF THE INVENTION

New materials with high dielectric constants and low loss tangents are needed in the electronics industry for use at high frequencies and as a means to enable further miniaturization. These materials are particularly useful if they can be made into thin films, sheets, plaques, and other molded shapes, so that they can be used as circuit boards at microwave frequencies, high energy density capacitors, filters, antennas, buried components, and multichip modules. These have a variety of end uses, as for example in wireless communications. Many ceramic materials have the desired high dielectric constant and low dielectric loss, but they are not readily made into thin films. Ceramic materials that have been fabricated into films and shaped articles are also generally brittle.

One approach to making films and sheets with the desired properties is to utilize a composition (also referred to herein as "composite") comprising a polymeric matrix and a ceramic filler having a high dielectric constant. This approach is difficult because the compositions need high levels of the ceramic filler in order to achieve the desired high dielectric constant while retaining rheological properties that make the compositions suitable for extrusion or molding. The compositions must also be stable to changes in ambient moisture (humidity) and temperature. Resistance to elevated temperatures, as well as high mechanical strength, impact resistance and chemical resistance are also all desirable. Finally, in many applications, flat substrates made from these materials will need to be made into laminates with copper and/or other materials.

Several high dielectric constant materials based on polymers combined with ceramics are known. For example, numerous patents are assigned to Rogers Corporation that teach composites of fluoropolymers, preferably poly(tetrafluoroethylene) (PTFE), and ceramic materials for use as high dielectric materials, as for example U.S. Pat. Nos. 4,335,180 and 5,358,775. Rogers Corporation sells some of these compositions of PTFE and ceramic fillers for use as high dielectric films. It is in general difficult to make thin films and other shaped articles of PTFE containing a filler.

A large number of other examples of high dielectric composite materials have been disclosed. Typical examples are U.S. Pat. No. 5,174,973, German patent publication DE 3,242,657, Japanese Patent Publications JP 5,307,911, JP 57,853, JP 98,069 and a published paper (S. Asai, et al., IEEE Transactions on Components, Hybrids and Manufacturing Technology, Vol. 16, No. 5, August, 1993, pp. 499–504).

The temperature stability of the dielectric constant is an important issue. The dielectric constants of high dielectric ceramics change with temperature. As a result, the dielectric constants of compositions of polymers and ceramics also change with temperature. The changes in dielectric constant affect the electrical properties of electronic components utilizing the compositions, such as, for example, the resonant frequency of a patch antenna. This may limit the usefulness of the devices, since they are only usable within limited temperature ranges. Outdoor use may be particularly unreliable. This problem has so far been addressed by making compositions that contain combinations of ceramic materials that have positive and negative temperature coefficients of dielectric constant, so that the changes in dielectric constant of the materials balance each other out. This approach is described in U.S. Pat. No. 5,552,210, Japanese Patent Publication No, 4,161,461 published in 1992, and commonly assigned co-pending U.S. application Ser. No. 08/646,403. An alternative approach is to make a composition in which the ceramic filler has a temperature coefficient of dielectric constant that is approximately zero. Such ceramic fillers are known but are very costly. A new approach that utilizes common high dielectric constant ceramic materials and common polymers is described below.

SUMMARY OF THE INVENTION

A polymeric composition which has a dielectric constant K' greater than 4 at 20° C. which varies little with temperature is made from a polymer or mixture of polymers and a ceramic or a mixture of ceramics as follows. The polymer or mixture of polymers has a dielectric constant K' in the range of about 1.5 to about 3.5 and a temperature coefficient of dielectric constant TCK' that is negative and is between 0 and about –300 ppm/degree C. The polymer or mixture of polymers is preferably thermoplastic but may also be a thermoset or non-thermoplastic fluoropolymer. The ceramic or mixture of ceramics is made up of:

(a) a first ceramic, which may be one ceramic or a mixture of ceramics, each having a dielectric constant in the range of about 15 to about 200 and a TCK' that is positive and is between zero and about 3000 ppm/degree C.; and (b) an optional second ceramic, which may be one ceramic or a mixture of ceramics, each having a dielectric constant in the range from about 3 up to about 15 and a TCK' that is positive and is between zero and about 300 ppm/degree C.

The amounts of the polymer and the ceramics are balanced so that the dielectric constant K' of the composition is greater than 4 and the changes with temperature of the dielectric constants of the polymer and ceramics offset each other, so that the dielectric constant K' of the composition varies by no more than 2% above or below the mean value of the dielectric constant in the temperature range between –50° C. and a higher temperature, which is either 80° C. or a temperature that is 10° C. less than the glass transition temperature of the polymeric composition, whichever is lower. The values of K' and TCK' are measured at 2.0 GHz frequency. The value of K' is measured at 20° C.

A thermoplastic polymeric composition having a temperature-stable dielectric constant is made by compounding a thermoplastic polymer or mixture of thermoplastic polymers having a dielectric constant K' in the range of about 1.5 to about 3.5 and a temperature coefficient of dielectric constant TCK' that is negative and is between zero and about –300 ppm/degree C. with one or more ceramics. The ceramics include a first ceramic, which may be a mixture of ceramics, each having a dielectric constant in the range of about 15 to about 200 and a positive TCK' that is between zero and about 3000 ppm/degree C.; and an optional second ceramic, which may be one or more ceramics, each having a dielectric constant that is in the range of about 3 up to about 15 and a TCK' that is greater than zero but less than 300 ppm/degree C. The amounts of the polymer and the first and second ceramics are balanced so that the dielectric constant of the composition is greater than 4, and the changes in dielectric constant of the polymer and ceramics offset one another so that the dielectric constant of the composition varies by no more than 2% above or below the mean value of the dielectric constant in the temperature range from −50° C. to a second higher temperature that is either 80° C. or is 10° C. less than the glass transition temperature of the polymeric composition, whichever is less. The values of K' and TCK' are measured at 2.0 GHz frequency and the value of K' is measured at 20° C.

These compositions are particularly useful in making laminates which have a temperature-stable dielectric constant. The laminates are made from a flat substrate composed of the polymeric composition described above, and a layer of metal adhering to at least one of the two surfaces of the substrate. The dielectric constant of the laminate is at least 4.0 at 2.0 GHz frequency and 20° C., and the dielectric constant of the laminate does not vary by more than 2% above or below the mean value of the dielectric constant of the laminate measured over the temperature range from −50° C. to a second higher temperature that is either 80° C. or 10° C. less than the glass transition temperature of the polymeric composition, whichever is less.

The laminates having a temperature-stable dielectric constant are made by shaping the polymeric composition described above into a flat substrate, and applying metal to one or both of the two surfaces of the flat substrate. "Shaping" means any process for making a polymer or polymer composition into a fabricated product, such as sheet, film, or other three dimensional object. Such processes include extrusion, injection molding, calendaring, compression molding, and the like. Finally, three-dimensional articles comprising the polymeric composition and one or more layers of metal may also be made by shaping processes in combination with processes for coating or applying metal layers.

The laminates can be stacked and interconnected to form substrates having multiple layers, with alternating layers of thermoplastic composition and metal. The layers may have different dielectric constants and different thicknesses, and may be assembled to form substrates for multichip modules and circuit boards.

DETAILED DESCRIPTION OF THE INVENTION

The combination of one or more polymers and one or more high dielectric ceramics as described herein, provides polymeric compositions that have dielectric constants that are greater than 4 and that are relatively constant with changing temperature. This makes them particularly useful in devices that may be exposed to large ranges of temperatures (e.g. outdoor use). The presence of the filler, especially in large quantities, also gives the compositions a reduced coefficient of thermal expansion (CTE) compared with the unfilled polymer. The reduced CTE makes the compositions more suitable for lamination with copper because there is less of a mismatch in CTE between the polymeric composition and copper, resulting in fewer problems with warping, delamination, and the like. Thermoplastic polymers are preferred, though other polymers, such as thermosets and non-thermoplastic fluoropolymers can also be used. The use of a thermoplastic polymer makes the compositions easier to fabricate, since they can be shaped by such common methods as injection molding and extrusion.

The choice of a polymer or polymers to be used also depends on the properties that are desired (e.g. thermal properties, loss tangent). The polymer or polymers must also have a negative TCK' as stated previously. If high temperature performance is not important, then a polymer that results in a polymeric composition (after adding the fillers) having an HDT greater than about 80° C. under a 264 psi load by ASTM Test Method D648 is sufficient. If higher temperature performance is needed, then the composition should have an HDT greater than about 200° C. when measured under the conditions described above.

Thermoplastic polymers that may be used in the practice of this invention may be crystalline, amorphous, or liquid crystalline. The preferred polymers for use in the composition disclosed herein are poly(phenylene sulfide), cycloolefinic copolymers (COC), and mixtures of these. These polymers both have a dielectric constant and temperature coefficient of dielectric constant in the ranges stated above (i.e. the K' of COC is about 2.4 and of PPS is about 3.1; the TCK' of the cyclolefenic copolymer of ethylene and norbornene is slightly negative, and the TCK' of PPS is about −50 ppm/degree C.). Poly(phenylene sulfide) (PPS) is a well known high temperature engineering polymer and is available from several manufacturers, including Hoechst Celanese Corporation under the FORTRON® trademark and Phillips Chemical Company under the RYTON® trademark. Cycloolefinic copolymers (COC) are a newer class of high temperature polymer. They may be homopolymers or copolymers of cyclic olefin monomers such as, for example, norbornene, tetracyclododecene, bicyclo[2,2,1 ]hept-2-ene, 1-methylbicyclo[2,2,1]hept-2-ene, hexacyclo[$6,6,1,1^{3,6}$, $1^{10,13}0^{2,7}$, $0^{9,14}$]-4-heptadecene, and the like. If it is a copolymer, preferably the comonomer is an acyclic olefin such as, for example, ethylene, propylene, butylene, pentene isomers and the like. Many such suitable cycloolefin copolymers are known. They are described, for example, in U.S. Pat. Nos. 5,087,677; 5,422,409; 5,324,801; 5,331,057; 4,943,611; 5,304,596 and EP 608903. An illustrative COC composition useful in the practice of this invention is a copolymer of norbornene and ethylene described in the above-mentioned U.S. Pat. No. 5,087,677 which is incorporated herein by reference. It is commercially available under the trademark TOPAS® from Hoechst Celanese Corporation, Somerville, N.J. Certain COC's are also available from Mitsui Petrochemicals, Ltd. under the APEL™ trademark.

The most preferred polymer for this invention is poly (phenylene sulfide) (PPS) because of its excellent thermal properties, its ease of molding, and its low loss tangent (also referred to as dielectric loss factor, dielectric loss, or dissipation factor).

The ceramic material or materials has a temperature coefficient of dielectric constant that is opposite in sign to that of the polymer, that the thermal coefficients of dielectric constant TCK' approximately balance each other out. This method of using a polymer and ceramic filler which have TCK' values that are opposite in sign and adjusting the amounts is referred to herein as "temperature compensation". Since the polymer matrix has a TCK' that is negative, the ceramics have a positive TCK'.

As stated previously, at least one ceramic filler is used (a "first" ceramic), which may be a mixture of ceramics. The ceramics, or each ceramic in the mixture, has a dielectric constant in the range of about 15 to about 200 and a TCK' greater than zero but less than about 3000 ppm/degree C. This first ceramic, which has a fairly high dielectric constant, is used to raise the dielectric constant of the composition most of the way or all the way to the desired dielectric constant. The optional second ceramic may also be a mixture of ceramics. The second ceramic material, or each of the second ceramic fillers, has a dielectric constant that is smaller than the K' of the first ceramic. The second ceramic is included to make it possible to control the coefficient of thermal expansion (CTE) as well as the dielectric constants. The amounts of the first and second ceramics can be varied so that more or less filler is needed to achieve a specific dielectric constant. When more ceramic filler is used, the composition has a lower CTE, since ceramics generally have a lower CTE than polymers. By lowering the CTE of the composition, there is less of a difference between the CTE of the composition and metal layers, such as copper, that are laminated onto the composition. Metals have an even lower CTE, and a large difference between the CTE of the composition and metal layers laminated onto substrates made from the composition cause stress when a laminate is heated or cooled, causing stresses between the layers, which can lead to delamination or bending of laminates. The use of two ceramics thus provides an additional degree of freedom to achieve a specific dielectric constant, as small an average TCK' as possible, and a low CTE. These properties are generally achieved by including the first ceramic in an amount of about 2% to about 60% by volume and the second ceramic in an amount up to about 50% by volume.

In preferred compositions, the TCK' of the first ceramic, or each of the first ceramics, is positive and is between zero and about 300 ppm/degree C., and the TCK' of the second ceramic or each of the second ceramics, is in the range between zero and about 200 ppm/degree C.

The dielectric constant of the composition, and laminates and other shaped products made from the composition, varies by no more than 2% above or below the mean dielectric constant of the composition or laminate, measured over the range between a low temperature of −50° C. and a higher temperature, which is either 80° C. or 10° C. less than the glass transition temperature of the composition, whichever is less. Preferably, the dielectric constant of the composition will vary by no more than 1% above or below the mean temperature referred to above, and most preferably by no more than 0.5%. The variability of the dielectric constant of the composition is measured up to a maximum temperature of 10° C. less than the glass transition temperature of the composition because the dielectric constant changes rapidly near the glass transition temperature of the composition.

Another desirable property in a ceramic and in polymer-ceramic compositions in general is a low loss tangent (dielectric loss factor). A low loss tangent is beneficial and often necessary to reduce noise and to minimize signal loss at high frequencies (above about 500 MHz). The preferred ceramics all have low loss tangents.

The first ceramic is preferably selected from the group of ceramics consisting of calcium zirconate, strontium zirconate, $CaTiSiO_5$, lead zirconate, zirconia and mixtures thereof. The optional second ceramic is preferably selected from the group consisting of aluminum oxide, magnesium titanate, mica, silicon dioxide (e.g. fused silica), beryllia, spinel, and thoria. Silicon dioxide also includes silicates having the required values of TCK' and K' (e.g. silica glass, lead alkali silicate and high lead alkali silicate). These are well known and are described in "Ceramic Dielectrics and Capacitors," by J. M. Herbert, Gordon and Breach Science Publishers, New York, 1985, page 228. A typical silica glass (96%) contains, other than oxygen, 94.3% Si, 0.2% Na, 0.1% K, 4.9% B, and 0.5% Al. A typical lead alkali silicate contains 68% Si, 16% Na, 8% K, 0.35% Ca, 0.3% Mg, 6% Pb, 0.4% B, and 0.8% Al. A typical high lead alkali silicate contains 58.5% Si, 15.5% K and 26% Pb. These all have values of K' and TCK' that fall into the ranges listed above, as shown in Tables 1 and 2, which list values of K' and TCK' for the ceramics in these two groups. They also have low loss tangents.

In a highly preferred combination of ceramics, the first ceramic is calcium zirconate and the second ceramic is one or more ceramics selected from the group consisting of mica, aluminum oxide, silicon dioxide, and magnesium titanate. In certain applications, it is desirable that this second ceramic is a mixture of mica with one or more ceramics from the group consisting of aluminum oxide, silicon dioxide, and magnesium titanate. This last combination is desirable because it adds one additional degree of freedom in designing compositions for specific uses. It uses both the first and second ceramics, which makes it possible to achieve a specific dielectric constant with a large enough volume of ceramic to avoid severe mismatches in CTE with other materials, such as metal layers in laminates. In addition, the second ceramic includes mica, which is in the form of a flat particle (a platelet), along with aluminum oxide, silicon dioxide, and/or magnesium titanate, which are more spherical in shape. The mica aligns itself in flat substrates during extrusion or injection molding processes so that the flat platelets are parallel with the plane of the substrate. This causes a significant difference in the CTE between the x and y directions compared with the z-direction (perpendicular to the substrate), as also occurs with pure mica alone. The particles that are approximately spherical in shape cause only a very small anisotropy in CTE in the x- and y- directions compared with the z-direction. Thus, mica in combination with ceramics having spherical geometry can be used to control the CTE in the x and y directions differently than in the z direction as desired, in situations where a difference between the x and y directions compared with the z direction is desirable or acceptable. If anisotropy of CTE is not desired, then aluminum oxide, silicon dioxide, or magnesium titanate, or a combination of these, is preferably used without mica as the second ceramic.

Finally, in some compositions, it is desirable to use calcium zirconate as the filler without other ceramics. Thus, compositions using calcium zirconate without other fillers in poly(phenylene sulfide) have advantageous properties. In particular they have a very low loss tangent.

The ceramic materials that may be used in this invention are well known in the art. Many are commercially available. Others are readily synthesized by known methods. For example, the metal titanates and zirconates can be made by sintering the metal oxides in the stoichiometric ratio needed to obtain the desired product. See for example "Ceramic Dielectrics And Capacitors," by J. M. Herbert, Gordon and Breach Science Publishers, New York, 1985, for more details on synthetic methods. Calcium zirconate is available from several manufacturers. Calcium zirconate and magnesium titanate are both available from Tam Ceramics, Niagara Falls, N.Y., and are sold as TICONI® 110 and TICON® 75 respectively. Mica, aluminum oxide, and silicon dioxide are widely used in many applications, and are often used as reinforcing fillers without the high dielectric ceramics that are disclosed herein.

Compounds of calcium zirconate in PPS are readily synthesized and are readily fabricated into shaped articles by such methods as injection molding and extrusion of films or sheets. Calcium zirconate is preferably used as a powder having an average particle size in the range of about 0.2 microns to about 10 microns, preferably about 1 to about 2 microns. Larger or smaller particle sizes can also be used, depending on the size and shape of the article to be fabricated. The electrical properties of the compounds are easily fine-tuned for specific applications by adjusting the amount of $CaZrO_3$ and adding one of the optional second ceramic materials, such as magnesium titanate, aluminum oxide, mica, silicon dioxide, or a mixture of some or all of these, to achieve the desired properties. The loss tangent is low at all levels of $CaZrO_3$, generally not exceeding 0.003 at a frequency of 2.0 GHz. Furthermore, because of the ease of mixing and injection molding these compositions, specific compositions can be made that give reproducible dielectric constants (i.e. the same composition always has the same dielectric constant).

Other additives may also be included in the polymeric compositions in addition to the high dielectric ceramic or ceramics. These include antioxidants, mold lubricants, light stabilizers, mold release agents, colorants, sizing and coupling agents, other reinforcing fillers, and ceramic materials having a low dielectric constant, which are not included as either the first or the second ceramic material.

The high dielectric polymer compositions disclosed herein are made by standard methods for making compounds of polymers and fillers. These methods typically involve mixing the filler and polymer at a temperature high enough to melt the polymer. Compounding of the polymer and ceramic filler in a twin screw extruder is the preferred method.

The polymeric compositions are readily made into shaped articles. The compositions may be shaped into films, sheets, plaques, disks, and other flat shapes which are particularly useful as substrates in electronics (e.g. printed circuit boards). Three dimensional shapes may also be made. The polymers may be shaped by many processes, such as extrusion, injection molding, and compression molding. Films and sheets typically are made by injection molding or extrusion processes.

Laminates having a high dielectric constant and low loss tangent are also readily made from these polymer compositions. Such laminates are particularly useful in making of circuits, such as antennas, filters, couplers, splitters, and the like. The laminates generally have a flat substrate of the polymeric composition described above, such as a sheet, film, or plaque, placed between two layers of copper or other metal. The metal has not necessarily been applied by a lamination process, so that the term "laminates" has a broader meaning and includes multilayer structures made by methods other than lamination. The flat substrates have two surfaces, other than the edges. The thickness of the substrate is a matter of choice, depending on the application, but generally will be in the range of about 1 mil to about 500 mils.

At least one of the surfaces of the flat substrate has a metal layer adhering to it, and generally both surfaces have a metal layer. The metal is present as an electrical conductor. Copper is the preferred metal, but others may be used, such as gold, titanium, silver and alloys thereof or with copper. The metal may be included in the form of a coating which has been applied by a coating process, such as vapor deposition or sputtering, or by electroplating onto a sheet whose surface has been activated for electroplating. The preferred method of applying the metal is by an actual lamination process, whereby metal film or foil is laminated onto the surfaces of the substrates. The metal film or foil is thin, generally being in the range of about ⅛ mil to about 12 mils. The words "foil" and "film" are used interchangeably herein when describing metal films and foils. The metal is laminated onto the filled polymer sheet (e.g. poly(phenylene sulfide) by the use of an adhesive or by heating the polymer to the melt temperature while the metal film or foil is pressed against the polymeric sheet. Alternatively, the metal film or foil can be laminated onto a freshly extruded sheet of filled polymer while the sheet is still in a molten or softened state by co-feeding the metal film or foil with the polymer sheet as it emerges from the die of the extruder and passing the metal film or foil and polymer sheet through an apparatus that applies pressure, such as a set of rollers. The most convenient method of making a laminate is to place the metal film or foil against the inner walls of a mold and then feed molten polymer into the mold under pressure in an injection molding process. The pressure of the molding process results in a laminate with good adhesion after the polymer cools and hardens. The preferred metal foil has a matte surface on one side to facilitate adhesion between the metal and the polymer. Foil can be obtained in which the matte surface has a surface profile with an arithmetic mean roughness value of about 1 micron and a mean peak to valley height of about 10 microns. These give acceptable adhesion. Foils can also be obtained that have been treated to increase the surface roughness on the matte side. These give better adhesion and are preferred.

As stated earlier, a low coefficient of thermal expansion is often necessary in making laminates to avoid warping. Warping can result from a large mismatch between the CTE of the flat substrate and the copper that is laminated to it. As long as there is copper on both surfaces of the substrate, there is no warping, even though there are forces resulting from a mismatch in CTE values. As copper is removed from one surface during subsequent manipulations, the laminate can bend. The high level of fillers in the polymeric compositions and the laminates results in a reduced CTE, which is closer to the CTE of the copper, resulting in reduced stresses and reduced warpage.

The dielectric laminates can be stacked and interconnected to form substrates having multiple layers, with alternating layers of thermoplastic composition and metal. The layers may have different dielectric constants and different thickness, to form substrates for multichip modules and circuit boards.

The high dielectric composites and laminates have many uses. For example, sheets, films, plaques, and the like may all be used as substrates for making printed circuit boards that are useable at microwave frequencies. Other uses for flat substrates include high energy density capacitors, filters, antennas, buried components, and multichip modules. An application for which these materials are particularly useful is printed circuit antennas, such as microstrip, dipole, and patch antennas, for wireless equipment. These kinds of antennas are typically flat because the substrate is a ceramic, and their emitted signals and response to received signals are therefore directional. These materials can easily be made in curved or other shaped forms so that the directionality of the antenna response (either transmitting or receiving) can be modified as desired. Other applications include printed (stripline or microstrip) and microwave circuit elements, such as transmission lines, inductors, capacitors, filters, (e.g. low pass filters, high pass filters, band pass filters, and band stop filters), signal couplers, branch line couplers, power splitters, signal splitters, impedance transformers, half wave and quarter wave transformers, and impedance matching circuits.

The invention is further illustrated by the following non-limiting examples. These examples all use poly (phenylene sulfide) as the thermoplastic polymer, but high dielectric compositions having temperature compensation can be made from other polymers having a K' between 2 and 3.5 and a TCK' between 0 and −300 ppm/degree C.

EXAMPLES 1–2

A series of two compositions of poly(phenylene sulfide) and calcium zirconate were made with the proportions shown in Table 3. FORTRON® W203 poly(phenylene sulfide), obtained from Hoechst Celanese Corporation, Bridgewater, N.J., was compounded in a BRABENDER™ melt mixer with TICON® calcium zirconate, purchased from Tam Ceramics, Inc., 4511 Hyde Park Boulevard, Niagara Falls, N.Y. 14305. The die temperature of the extruder was about 300° C. and the screw speed was 60 rpm. The compounded product was extruded into water and pelletized. The ceramic before compounding was a powder having an average particle size ranging from about 1 to 2 microns.

The pelletized compounds were made into ⅛" thick (2–2½" in diameter) discs by injection molding using a BOY30M injection molding machine at a melt temperature of about 300° C.–310° C. The dielectric constants and loss tangents at 2.0 GHz and 20° C. were measured by the cavity resonance technique according to ASTM Test Method No. D2520, Method B. These data are presented in Table 3. For comparison, the dielectric constant and loss tangent of poly(phenylene sulfide) at 2 GHz and 21° C. are 3.1 and 0.0023 respectively.

EXAMPLE 3

A compound of FORTRON W203, calcium zirconate, and mica was made by the same method as was used in Example 1–2, except for the addition of mica as a co-filler. The mica was obtain from KMG Minerals, Inc., Kings Mountain, N.C. 28086, and was designated L-140. The mica was in the form of platelets having an average particle size of about 70 microns. The dielectric measurements were made using the same methods as in Example 1 and 2. The compositions and dielectric measurements are shown in Table 3.

It is to be understood that the above-described embodiments of the invention are illustrative only and that modification throughout may occur to one skilled in the art. Accordingly, this invention is not to be regarded as limited to the embodiments described herein.

TABLE 1

| | First Ceramic | |
|---|---|---|
| Ceramic | TCK' (ppm/degree C.) | K' |
| Calcium Zirconate | +40[1] | 30[1] |
| | −27 to 76[2,3] | 25–31[2] |
| Strontium Zirconate | +120[1] | 38[1] |
| | +120 to 140[2] | 27 to 30[2] |
| CaTiSiO$_5$ | +1200[1,2] | 45[1,2] |
| PbZrO$_3$ | +1400[2] | 110[2] |
| Zirconia | +170[2] | 18–24[2] |

[1]Young Soo Lee et al "Barium Tetratitanate MIC Technology" IEEE Transactions on Microwave Theory and Techniques, Vol MTT-27, No 7, July 1979
[2]J. M Herbert, "Ceramic Dielectrics and Capacitors", Electrocomponent Science and Monographs, Vol 6, Gordon and Breach Science Publishers, New York, 1985
[3]Experiments on Calcium Zirconate/PPS are consistent with positive TCK' at 2 GHz.

TABLE 2

| | Second Ceramic | |
|---|---|---|
| Ceramic | TCK' (ppm/degree C.) | K' |
| Aluminum Oxide | +136[1] +100 to +200[2] | 9.8[1] 8.9 to 9.9[2] |
| Fused silica | +12 to +13[1] +40[2] | 3.78 to 3.85[1] 3.78[2] |
| Mica | +10 to 80[2] | 5.4 to 8.7[2] |
| MgTiO$_3$ | 100[1] +100 ± 40[2] | 16[1] 13 ± 1[2] |
| Beryllia K120 | +100[2] | 6.6[2] |
| Spinel | +130[2] | 7.5[2] |
| Thoria | +100[2] | 13.5[2] |

[1]Young Soo Lee et al "Barium Tetratitanate MIC Technology" IEEE Transactions on Microwave Theory and Techniques, Vol MTT-27, No 7, July 1979
[2]J. M Herbert, "Ceramic Dielectrics and Capacitors", Electrocomponent Science and Monographs, Vol 6, Gordon and Breach Science Publishers, New York, 1985

TABLE 3

| | | | | | | | Dielectric Measurements | | |
|---|---|---|---|---|---|---|---|---|---|
| Example | PPS Vol % | CaZrO$_3$ Vol % | Mica Vol % | PPS wt % | CaZrO$_3$ weight % | Mica wt % | Dielectric Constant (ambient temp) | Loss Tangent (ambient temp) | % Change of K' from mean (−50° –80° C.) |
| 1 | 55 | 45 | — | 27.55 | 72.45 | — | 8.58 | 0.0017 | ±0.9% |
| 2 | 58 | 42 | — | 30.05 | 69.95 | — | 7.99 | 0.0017 | ±0.6% |
| 3 | 58 | 30 | 12 | 32.48 | 54.00 | 13.52 | 6.72 | 0.0019 | ±0.4% |

We claim:

1. A polymeric composition having a temperature-stable dielectric constant, consisting essentially of:
   (a) a polymer having a dielectric constant K' in the range of about 1.5 to about 3.5 and a temperature coefficient of dielectric constant TCK' less than 0 but greater than about −300 ppm/degree C., wherein said polymer is selected from the group consisting of poly(phenylene sulfide), cycloolefinic copolymer, and mixtures thereof,
   (b) a first ceramic, consisting of one or more ceramics selected from the group consisting of calcium zirconate, strontium zirconate, CaTiSiO$_5$, PbZrO$_3$, zirconia and mixtures thereof, each having a dielectric constant in the range of about 15 to about 200 and a TCK' greater than zero up to about 3000 ppm/degree C.; and (c) an optional second ceramic, consisting of one or more ceramics selected from the group consisting of aluminum oxide, magnesium titanate, mica, silicon dioxide, beryllia, spinel, and thoria, each having a dielectric constant in the range of about 3 to about 15 and a TCK' greater than zero up to about 300 ppm/degree C.;

wherein the amounts of said polymer and said first and second ceramics are balanced so that the dielectric constant of the composition is greater than 4 and the dielectric constant of said composition varies by no more than 2% above or below the mean value of the dielectric constant in the temperature range from −50° C. to a higher temperature that is the lesser of 80° C. and 10° C. less than the glass transition temperature of said polymeric composition; wherein said values of K' and TCK are measured at 2.0 GHz frequency, and said value of K' is measured at 20° C.

2. A polymeric composition as recited in claim 1, wherein said first ceramic has a TCK' greater than zero up to about 300 ppm/degree C., and said second ceramic has a TCK' greater than zero up to about 200 ppm/degree C.

3. A polymeric composition as recited in claim 1, wherein the dielectric constant of said composition varies by no more than 1% above or below the mean value of the dielectric constant of said composition in the range from −50° C. to a higher temperature that is the lesser of 80° C. and 10° C. less than the glass transition temperature of said polymeric composition.

4. A polymeric composition as recited in claim 1, wherein the dielectric constant of said composition varies by no more than 0.5% above or below the mean value of the dielectric constant in the range from −50° C. to a higher temperature that is the lesser of 80° C. and 10° C. less than the glass transition temperature of said polymeric composition.

5. The polymeric composition as recited in claim 1, wherein said first ceramic is included in an amount of about 2% to about 60% by volume and said optional second ceramic is included in an amount up to about 50% by volume.

6. The polymeric composition as recited in claim 1, wherein said first ceramic is calcium zirconate and said optional second ceramic is selected from the group consisting of mica, aluminum oxide, silicon dioxide, magnesium titanate and mixtures thereof.

7. The polymeric composition as recited in claim 6, wherein said optional second ceramic is not included in said composition.

8. A laminate having a temperature-stable dielectric constant, comprising:

(a) a flat substrate comprising the polymeric composition of claim 1, said substrate having two surfaces; and (b) a layer of metal adhering to at least one surface of said substrate;

wherein the dielectric constant of said laminate is at least 4.0 at 2.0 GHz frequency and 20° C., wherein the dielectric constant of said laminate does not vary by more than 2% above or below the mean value of the dielectric constant of said laminate measured over the temperature range from −50° C. to a higher temperature that is the lesser of 80° C. and 10° C. less than the glass transition temperature of said polymeric composition.

9. A laminate as recited in claim 8, wherein said metal is copper.

10. A multichip module comprising the polymeric composition of claim 1.

11. A three-dimensional article comprising the polymeric composition of claim 1 and one or more layers of metal.

12. A polymeric composition having a temperature-stable dielectric constant, comprising:

(a) poly(phenylene sulfide);

(b) a first ceramic material selected from the group of ceramic materials consisting of calcium zirconate, strontium zirconate, $CaTiSiO_5$, $PbZrO_3$, zirconia, and mixtures thereof; and (c) an optional second ceramic material selected from the group consisting of aluminum oxide, magnesium titanate, mica, silicon dioxide, beryllia, spinel, thoria, and mixtures thereof;

wherein the amounts of said polymer, said first ceramic, and said optional second ceramic are balanced so that said composition has a dielectric constant greater than 4, and the dielectric constant of said composition varies by not more than 2% above or below the mean value of the dielectric constant of said composition in the temperature range of −50° C. to 80° C.; wherein said values of K' and TCK' are measured at 2.0 GHz frequency, and said value of K' is measured at 20° C.

13. The polymeric composition as recited in claim 12, wherein said first ceramic is included in an amount of about 2% to about 60% by volume and said second ceramic is included in an amount up to about 50% by volume.

14. The polymeric composition as recited in claim 13, wherein said first ceramic is calcium zirconate and said second ceramic is selected from the group consisting of mica, aluminum oxide, silicon dioxide, magnesium titanate and mixtures thereof.

15. The polymeric composition as recited in claim 13, wherein said first ceramic is calcium zirconate, and said second ceramic is not present.

16. A laminate having a temperature-stable dielectric constant, comprising:

(a) a flat substrate comprising the polymeric composition of claim 12, said substrate having two surfaces; and (b) a layer of metal adhering to at least one surface of said substrate;

wherein the dielectric constant of said laminate is at least 4.0 at 2.0 GHz frequency and 20° C., wherein the dielectric constant of said laminate does not vary by more than 2% above or below the mean value of the dielectric constant of said laminate measured over the temperature range from −50° C. to 80° C.

17. A laminate as recited in claim 16, wherein said metal is copper, said copper adhering to both surfaces of said substrate.

* * * * *